United States Patent [19]

Stückler

[11] 4,333,586
[45] Jun. 8, 1982

[54] INSERTION MACHINE FOR INTEGRATED CIRCUITS

[76] Inventor: Gerd Stückler, Birkenweg 18, D-8151 Osterwarngau, Fed. Rep. of Germany

[21] Appl. No.: 81,332

[22] Filed: Oct. 3, 1979

[30] Foreign Application Priority Data

Oct. 10, 1979 [DE] Fed. Rep. of Germany ....... 2844169

[51] Int. Cl.³ ............................................. B65G 59/06
[52] U.S. Cl. .................................... 221/106; 221/121; 221/251; 29/741
[58] Field of Search ................. 221/92, 103, 104, 106, 221/119, 121, 251, 289, 312; 209/573; 29/741

[56] References Cited

U.S. PATENT DOCUMENTS

| | | | |
|---|---|---|---|
| 3,550,238 | 12/1970 | Allen et al. | 29/741 X |
| 3,591,911 | 7/1971 | Goldschmied | 29/626 |
| 3,896,935 | 7/1975 | Hjelle et al. | 209/573 |
| 4,063,347 | 12/1977 | Woodman | 29/741 X |
| 4,149,641 | 4/1979 | DeVita et al. | 221/251 X |
| 4,202,092 | 5/1980 | Shibasaki et al. | 29/741 |

FOREIGN PATENT DOCUMENTS 2005825  9/1970  Fed. Rep. of Germany .

Primary Examiner—Joseph J. Rolla
Attorney, Agent, or Firm—Toren, McGeady & Stanger

[57] ABSTRACT

An insertion machine for integrated circuits includes a number of upwardly extending bars arranged in side-by-side relation on a carrier plate with a driving mechanism moving the carrier plate relative to an output device. Each bar has a displaceable lock at the bottom end for holding the bottom integrated circuit within the bar until it is to be moved into the output device. The carrier plate can be a hollow cylinder or a flat plate. The bars are removably mounted on the carrier plate by locking elements engageable with complementary locking elements in the carrier plate.

13 Claims, 6 Drawing Figures

INSERTION MACHINE FOR INTEGRATED CIRCUITS

The invention relates to an insertion machine for integrated circuits according to the definition of the species of claim 1.

Integrated circuits are electronic units where two rows of connection pins are provided on a housing containing the various electronic elements. There are integrated circuits of different length and width. For the formation of electronic circuits, integrated circuits are inserted by hand or automatically into printed circuits and soldered, for example. This operation is called insertion.

Machines of the above described type for insertion are known.

For example, FIG. 1 shows a known insertion machine, which consists substantially of a surface inclined by an angle alpha, on which the individual sections 2, 3 and 4 are applied. The integrated circuits 8, 9 and 10 are placed on these sections in the manner shown in FIG. 1, and can be removed by hand at stops 5, 6 and 7. If integrated circuit 8, for example, is removed at stop 6, the integrated circuits 9 and 10 slide forward, due to the inclination of section 3, until integrated circuit 9 is at stop 6. In the represented arrangement, a plexiglass cover can be so arranged that the integrated circuit can not drop out.

Insertion machines are also known where the individual integrated circuits are arranged in a bar for receiving the integrated circuits, a so-called IC-bar. Each IC-bar rests on a flange on which is arranged a magnetic flap. In operation, the numerous magnetic flaps associated with the various IC-bars are controlled and opened by a program. When a flap is opened, an integrated circuit drops out and arrives at a point at which it can be readily removed by hand.

A disadvantage of this arrangement is that the many IC-bars are arranged both close side by side and close one behind the other. This has the result that filling of the bars is difficult and time-consuming, due to the existing inaccessibility.

In the case where all bars are empty at about the same time, refilling of the bars takes a long time in such a system. During this time, the system is blocked and the insertion process must be stopped. Investigations have shown that at least two operators must be used constantly for refilling in such an automatic machine. During the refilling, the machine is stopped.

The close arrangement of the IC-bars, both side by side and in series, results in insertion errors, since the compact arrangement of the bars makes checking difficult.

The high production costs of such automatic insertion machines are due to the fact that a separate mechanism for releasing the integrated circuits contained therein must be provided for each IC-bar.

Finally it is difficult to combine IC-bars of different width in such an arrangement.

The object of the present invention is to avoid the above described drawbacks.

This problem is solved by an insertion machine of the above described type, which is characterized by the features listed in the characterizing portion of claim 1.

An essential advantage of the invention is that only a single output device is required to release individual integrated circuits for all IC-bars. The insertion machine according to the invention is therefore less costly to produce than the machines of the state of the art.

Another advantage of the present invention is that, when all IC-bars arranged on the carrier are empty, completely filled IC-bars arranged on another carrier can be inserted with one manipulation without additional waiting periods.

The output device, which releases the individual integrated circuits, can be preferably so designed that the length of the integrated circuits is automatically taken into account.

The invention will be described more fully below with reference to the drawings.

Figure 1:
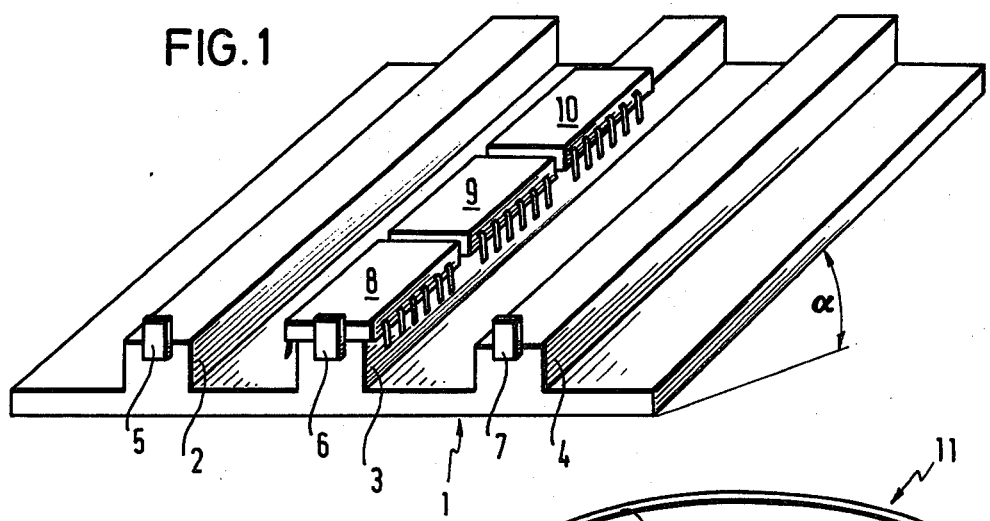
FIG. 1 shows a known IC insertion machine.
Figure 2:
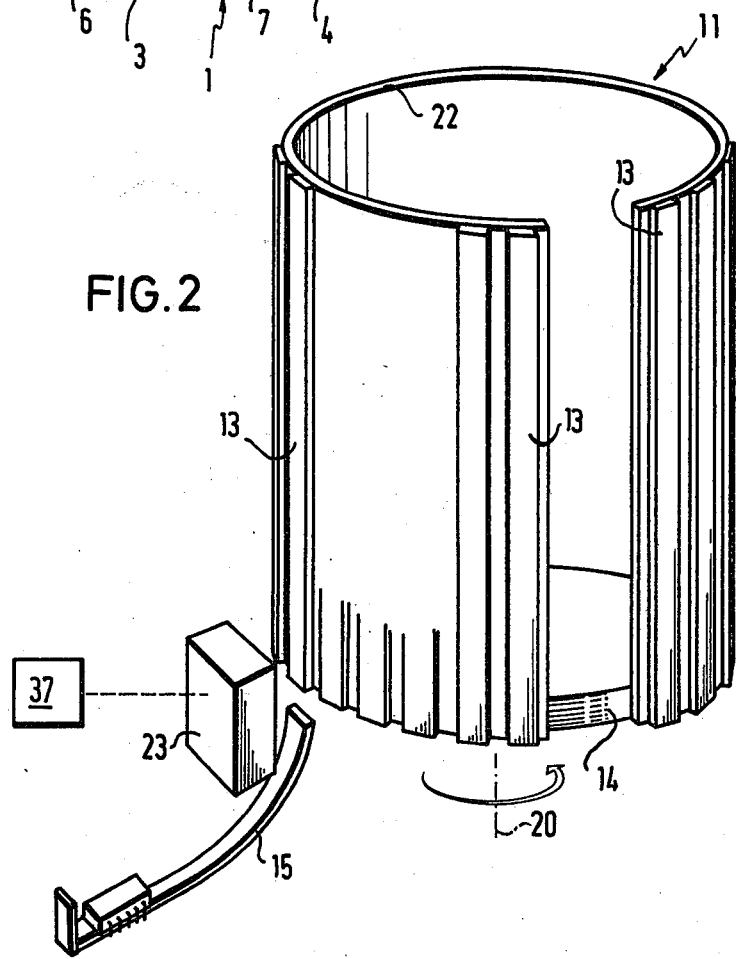
FIG. 2 shows an IC insertion machine according to the invention.

In FIG. 2, the insertion machine according to the invention is designated with 11. It is designed as a separator and supplies the integrated circuits in a given order for insertion. On a carrier plate 22 are arranged a plurality of parallel removable IC-bars 13. Carrier plate 22 is made of a flexible material, particularly glass fiber-reinforced epoxy resin. Due to its flexible properties, carrier plate 22, which is flat, can be bent to a hollow cylinder and be attached on a rotary plate 14. Rotary plate 14 is rotated by a driving mechanism (not shown) about the substantially vertical cylinder axis designated with 20 in FIG. 2. The IC-bars 13 extend parallel to cylinder axis 20. An output device 23 which is common to all IC-bars 13 is provided for removing the integrated circuits. This output device 23 opens a lock provided on the underside of each IC-bar 13, so that a single integrated circuit can emerge from IC-bar 13 and pass over to an output chute 15 arranged underneath. The IC-bars 13 contain different types of IC's. A program control 37 controls the rotary movement of rotary plate 14 in order to bring IC-bar 13 with the desired type of integrated circuit above an output chute 15 of output device 23. Program control 37 controls beyond that output device 23. The integrated circuit released by output device 23 slides down until it strikes a stop of chute 15, from which it can be removed by hand. Chute 15 extends preferably into the space between the bottom part of the housing and the connection pins of the integrated circuit.

Figure 3:
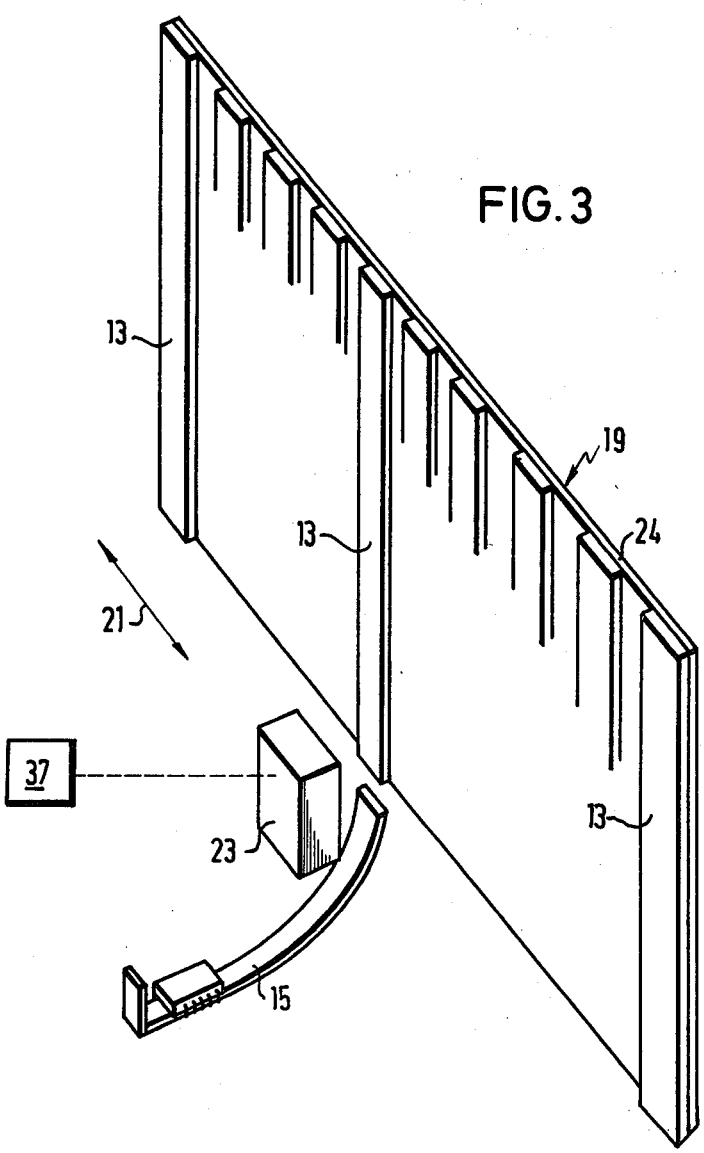
FIG. 3 shows an embodiment of an insertion machine according to the invention.

FIG. 3 shows another embodiment of an insertion machine 19 which differs from the insertion machine in FIG. 2 substantially in that it has a plane rigid carrier plate 24 as a carrier for IC-bar 13. Carrier plate 24 can be displaced by means of a driving mechanism (not shown) in the direction of its plane transverse to the substantially vertical IC-bars 13, so that the bottom ends of IC-bars 13, locked by a locking mechanism, can be brought through an output chute 15 to an output device 23, similar as in FIG. 2. A program control 37 is again provided for controlling the sequence of motions and the output operation.

Essential for the above-described embodiments of the insertion machines is that carrier plates 22 and 24 resp. can be removed by the respective driving mechanism and be loaded separately with integrated circuits. The insertion machine has a single output device, over which the integrated circuits can be delivered successively in the order in which they were inserted by the program control, to a point which is readily accessible by hand. The insertion machine merely has to be stopped for a period necessary to change carrier plates 22 and 24 resp.

Figure 4:
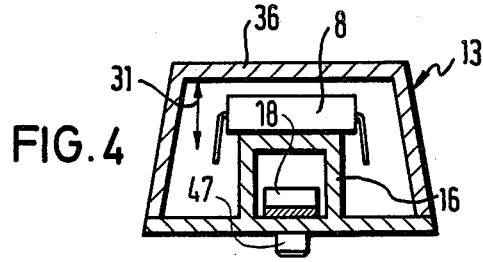
FIG. 4 shows a cross section through an IC-bar.
Figure 5:
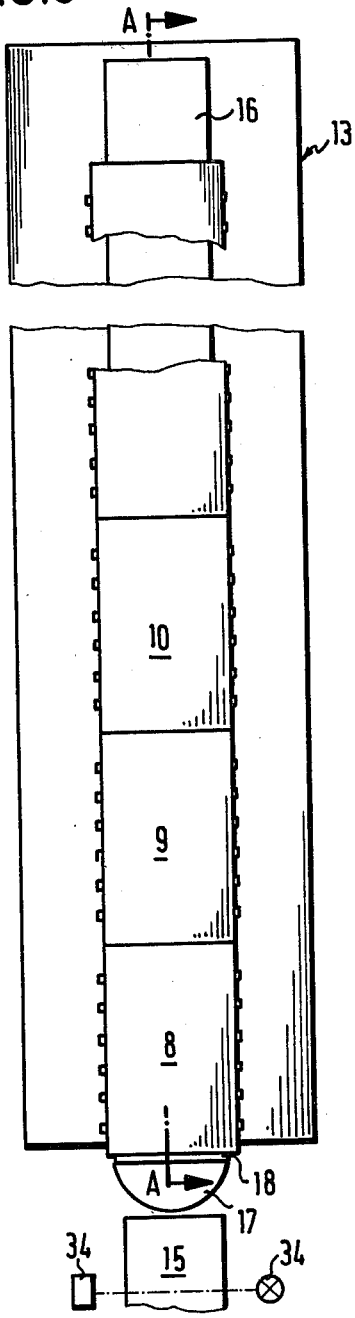
FIG. 5 shows a top view of an IC-bar where the top cover plate of the bar is not shown.
Figure 6:
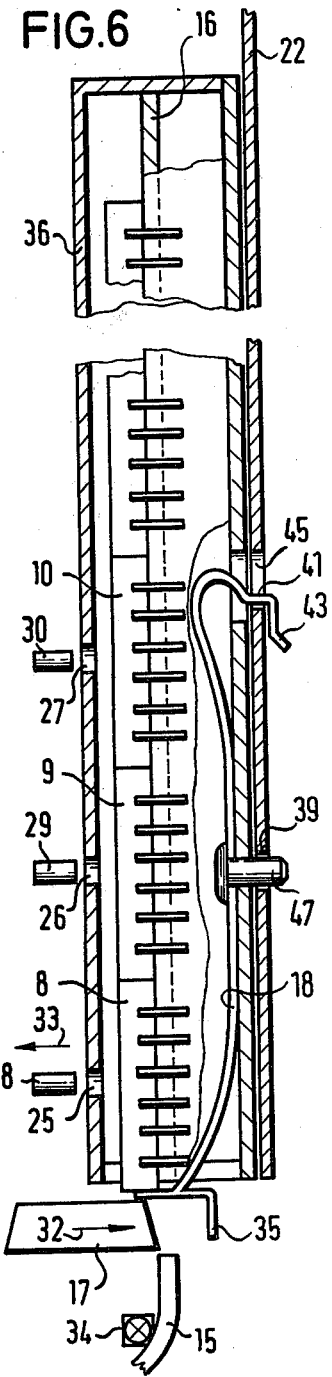
FIG. 6 shows a longitudinal section through the IC-bars according to FIG. 5 along line A—A.

FIGS. 4 to 6 show details of the IC-bars and of the output device. As it can be seen best from FIG. 4, IC-bars 13 have a box-shaped hollow section in which the integrated circuits, e.g. circuit 8, slide by their own weight from the top to the bottom in the operating position of the carrier plate. The integrated circuits are held between a guide section 16 and a top plate 36, with guide section 16 extending between the connection pins of the integrated circuits, ensuring transverse guidance. Top plate 36 forms a cover section which extends around guide section 16. A top view of IC-bar 13 with top plate 36 removed, is shown in FIG. 5.

Each of the IC-bars 13 comprises a lock formed by a flat spring 18, whose bottom end extends in front of the bottom exit opening of IC-bar 13 and prevents integrated circuits 8,9,10 from dropping out. A slide 17 of output device 23, provided with a passage for the integrated circuits, acts on a lug 35 projecting downward from the bottom end of flat spring 18, which can be moved by means of an electromotor in the direction of arrow 32, so that the exit opening of bar 13 is cleared. The bottom integrated circuit 8 emerges from IC-bar 13 and moves through chute 15 in the removal position. A light barrier 34 of program control 37 engages the integrated circuit emerging from IC-bar 13.

In order to prevent that more than one integrated circuit emerges from the IC-bar, output device 23 has three pins 28,29,30, spaced in longitudinal direction one above the other, each of which can be pressed by means of an electromagnet through an associated opening 25,26 or 27 in top plate 36 on the respective integrated circuit behind it. The electromagnets of pins 28,29,30 are controlled by program control 37 corresponding to the longitudinal dimension of the integrated circuits in the IC-bar. The distances of pins 28,29,30 from each other and from the bottom end of flat spring 18 forming the lock are so selected that integrated circuits of different length can be held. If pins 28,29,30 are lifted in the direction of an arrow 33, the integrated circuits can pass by. If the integrated circuits are moved into the IC-bar opposite the direction of arrow 33, they are clamped therein. The distance of botton pin 28 from the bottom end of flat spring 18 is slightly greater than the longitudinal dimension of the smallest integrated circuit used. If integrated circuits of the smallest type are used, the second integrated circuit from the bottom is retained by pin 28, while the bottom integrated circuit can drop out when the lock is open. The distance of pin 29 from pin 28 is so selected that it can just engage the second last integrated circuit of the next larger type at the upper end. The bottom integrated circuit of the next larger type can thus drop out with the lock open, without the next integrated circuit dropping out too. Pin 30 is so far away from the bottom end of flat spring 18 that it can separate integrated circuits of the largest type used. The distances of pins 28,29,30 are determined by the longitudinal dimensions of the various types of the integrated circuits. If necessary, additional pins can be provided. Instead of pins 28,29 and 30, can also be provided other feed mechanisms, e.g. intermittently driven rollers etc.

In order to be able to attach IC-bars of different width on carrier plates 22 and 24, the latter are exchangeable. The indexing of the IC-bars on the carrier plates is effected by means of a fitting pin 47, which engages a fitting opening 39 of the carrier plate. Fitting pin 47 forms at the same time the fastening element for leaf spring 18, which is bent at its upper end to a hook 41 with an inlet bevel 43. Hook 41 of leaf spring 18 extends through an opening 45 of carrier plate 22. If necessary, additional spring hooks of a similar type (not shown) can be arranged on IC-bar 13. Carrier plate 22 has more openings 39,45 than IC-bars can be arranged. With a slight lateral distance, it is thus also possible to secure IC-bars of different width on the same carrier plate.

The height of the carrier plate corresponds preferably to the length of the IC-bars. For example, carrier plate 22 shown in FIG. 2, can be about 0.5 m wide and 1.2 m long. On such a carrier plate can be arranged about 100 standard IC-bars. Despite this greater number of bars, the dimensions of the insertion machine are small.

I claim:

1. Insertion machine for integrated circuits, comprising a magazine (13,22,24) with several bars (13) arranged side by side to receive the integrated circuits (8,9,10) in a row one above the other, a lock at the bottom end of each of said bars, an output device (15,23) which receives and conveys the integrated circuits (8,9,10), after the lock of the bars (13) has been opened, from the bars (13) into a removal position, characterized in that a driving mechanism (14) moves the magazine (13,22,24) relative to said output device (15,23) common to the bars (13), a plate-shaped carrier (22,24) mounting said bars (13) and held exchangeably on said drive (14), the carrier is a flexible plate (22), which is bent into a hollow cylinder and secured on the driving mechanism (14), and is turned by the driving mechanism about the cylinder axis (20), said bars (13) are held removably on the plate (22,24) and carry locking elements (47,41) with complementary locking elements (39,45) in the plate (22,24).

2. Insertion machine according to claim 1, characterized in that the plate (22) consists of glass fiber-reinforced plastic.

3. Insertion machine according to claim 1, characterized in that the complementary locking elements (39,45) of the plate (22) are arranged in a raster which permits the fastening of bars (13) of different width.

4. Insertion machine for integrated circuits, comprising a magazine (13,22,24) with several bars (13) arranged side by side to receive the integrated circuits (8,9,10) in a row one above the other, a lock at the bottom end of each of said bars, an output device (15,23) which receives and conveys the integrated circuits (8,9,10), after the lock of the bars (13) has been opened, from the bars (13) into a removal position, characterized in that a driving mechanism (14) moves the magazine (13,22,24) relative to said output device (15,23) common to the bars (13), a plate-shaped carrier (22,24) mounting said bars (13) and held exchangeably on said drive (14), said carrier is a plane plate (24) of rigid material, which can be displaced horizontally by said driving mechanism, said bars (13) are held removably on the plate (22,24) and carry locking elements (47,41) with complementary locking elements (39,45) in the plate (22,24).

5. Insertion machine according to claim 1 or 4, characterized in that a leaf spring (18) is secured on each of the bars (13), whose bottom end extends as said lock in front of the bottom end of the bar (13), and whose top end is designed as a hook (41) bent toward the plate (22), which can be hooked into an associated opening (45) of the plate (22).

6. Insertion machine according to claim 5, characterized in that the leaf spring (18) is secured on the bar (13) with a fitting pin (47) projecting toward the plate (22), and an associated fitting opening (39) in the plate (22).

7. Insertion machine for integrated circuits, comprising a magazine (13,22,24) with several bars (13) arranged side by side to receive the integrated circuits (8,9,10) in a row one above the other, a lock at the bottom end of each of said bars, an output device (15,23) which receives and conveys the integrated circuits (8,9,10), after the lock of the bars (13) has been opened, from the bars (13) into a removal position, characterized in that a driving mechanism (14) moves the magazine (13,22,24) relative to said output device (15,23) common to the bars (13), a plate-shaped carrier (22,24) mounting said bars (13) and held exchangeably on said drive (14), said lock at the bottom end of the bar (13) comprises a leaf spring (18) connected with the bar (13), which closes in its rest position the bottom end of the bar, and that the leaf spring (18) has a projection (35) which is engaged by a slide (17) of the output device (23) in the position of the magazine (13,22,24) determined by the output device (23).

8. Insertion machine according to claim 1, 7 or 4, characterized in that the bar (13) has a guide section (16) extending between the connection pins of the integrated circuit, that a top plate (36) is provided above the guide section (16), and that the distance between the top plate (36) and the guide section (16) is so selected that the integrated circuit is held on the guide section (16).

9. Insertion machine according to claim 1, 7 or 4, characterized in that the output device (15,23) has a guide chute (15) adjoining the underside of the bars (13).

10. Insertion machine according to claim 1, 7 or 4, characterized in that the output device (23) has a controllable clamping mechanism (28,29,30) acting on the integrated circuits above the lock, which prevents the second last integrated circuit (9) from sliding down when the lock is opened.

11. Insertion machine according to claim 10, characterized in that the clamping mechanism has several individually controllable pins (28,29,30) arranged in a distance from the lock and from each other one above the other for movement transverse to the bar (13) which, when actuated, press the integrated circuits (8,9,10) against the bar (13).

12. Insertion machine according to claim 11, characterized in that the bottom pin (28) is arranged in such a distance from the lock that it acts in the bottom range of the second-last circuit of the smallest longitudinal dimension to be processed.

13. Insertion machine according to claim 11, characterized in that the second-last pin (29) is arranged in such a distance from the bottom pin (28) that it acts in the top range of the second-last integrated circuits of the longitudinal dimension to be processed.

* * * * *